United States Patent
Pan et al.

(10) Patent No.: US 6,207,538 B1
(45) Date of Patent: Mar. 27, 2001

(54) METHOD FOR FORMING N AND P WELLS IN A SEMICONDUCTOR SUBSTRATE USING A SINGLE MASKING STEP

(75) Inventors: Kuo-Hua Pan, Taichung; Chu-Wei Hu, Hsin-Chu; Chung-Te Lin, Tainan, all of (TW); Chin-Hsiung Ho, Sunnyvale, CA (US)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/472,998

(22) Filed: Dec. 28, 1999

(51) Int. Cl.[7] .................................................. H01L 21/04
(52) U.S. Cl. .................... 438/510; 438/228; 438/232; 438/527; 438/648
(58) Field of Search .................... 438/510, 232, 438/228, 527, 648

(56) References Cited

U.S. PATENT DOCUMENTS

| | | | |
|---|---|---|---|
| 5,091,332 | 2/1992 | Bohr et al. | 437/69 G |
| 5,252,501 | 10/1993 | Moslehi | 437/34 |
| 5,393,677 | 2/1995 | Lien et al. | 437/28 |
| 5,506,438 | 4/1996 | Hsue et al. | 257/376 |
| 5,547,894 | 8/1996 | Mandelman et al. | 437/56 |
| 5,573,963 | 11/1996 | Sung | 437/34 |
| 5,583,062 | 12/1996 | Kapoor | 437/31 |
| 5,670,395 | 9/1997 | Pan | 437/34 |
| 5,736,440 | * 4/1998 | Manning | 438/232 |
| 5,759,884 | * 6/1998 | Youn | 438/228 |
| 5,985,743 | * 11/1999 | Gardner | 438/527 |
| 6,087,253 | * 7/2000 | Liaw | 438/648 |

OTHER PUBLICATIONS

Horiuchi et al., "A 7–Mask CMOS Process with Selective Oxide Deposition", IEEE Transactions on Electron Devices, vol. 40, No. 8, Aug. 1993, pp. 1455–1460.

* cited by examiner

Primary Examiner—Richard Elms
Assistant Examiner—Pho Luu
(74) Attorney, Agent, or Firm—George O. Saile; Stephen B. Ackerman; William J. Stoffel

(57) ABSTRACT

A method for forming both n and p wells in a semiconductor substrate using a single photolithography masking step, a non-conformal oxide layer and a chemical-mechanical polish step. A screen oxide layer is formed on a semiconductor substrate. A barrier layer is formed on the screen oxide layer. The barrier layer is patterned to form a first opening in the barrier layer over regions of the substrate where first wells will be formed. We implant impurities of a first conductivity type into the substrate to form first wells. In a key step, a non-conformal oxide layer is formed over the first well regions and the barrier layer. It is critical that the non-conformal oxide layer formed using a HDPCVD process. The non-conformal oxide layer is chemical-mechanical polished stopping at the barrier layer. The barrier layer is removed using a selective etch, to form second openings in the remaining non-conformal oxide layer over areas where second well will be formed in the substrate. Using the remaining non-conformal oxide as a mask, we implant impurities of the second conductivity type through the second openings to form second wells. The remaining non-conformal oxide layer and the screen oxide layer are removed.

17 Claims, 3 Drawing Sheets

METHOD FOR FORMING N AND P WELLS IN A SEMICONDUCTOR SUBSTRATE USING A SINGLE MASKING STEP

BACKGROUND OF INVENTION

1) Field of the Invention

This invention relates generally to formation of wells in a semiconductor substrate and more particularly to the formation of both n-wells and p-wells using a single photo masking step.

2) Description of the Prior Art

In the fabrication of CMOS devices it is frequently desirable to make a complimentary or symmetric environment with respect to the NMOS and PMOS devices. In other words, it is frequently necessary to create suitable n-type regions for the PMOS devices and suitable p-type regions for the NMOS devices. Each of these n-type and p-type regions is generally referred to as a "well". Currently, when n-wells and p-wells are formed in the same substrate, they are formed using two separate masking steps.

It is known that formation of such n-wells and p-wells may be acheived by the implantation of an appropriate dopant species, such as boron or phosphorus, into a suitable substrate followed by high temperature drive-in of the implanted ions.

One typical process is a two-mask, self-aligned LOCOS twin-well process with two separate well implants. First, a photo resist layer is formed covering the p-well regions. Then n-type impurities are implanted into the n-well regions of the substrate and the first photo resist layer is removed. Next, a thick masking oxide (LOCOS) is selectively grown over the n-well regions. This masking oxide consumes a significant depth of the silicon surface and causes topography that can interfere with subsequent overlaying layers. The masking oxide (LOCOS) typically has a thickness in a range between about 2,000 and 6,000 Å and consumes a depth of the silicon substrate in a range between about 1,000 and 3,000 Å. Then, using the masking oxide (LOCOS) as an implant mask, p-type impurities are implanted into the p-well regions of the substrate. The masking oxide is removed by a selective etching process, forming depressions in the substrate surface. A nitride masking layer is deposited and patterned to cover the active areas using a second resist layer. As device size is reduced and device density is increased, the alignment of separate masks becomes increasingly critical, reducing yields and requiring costly additional inspection procedures. A field oxide is formed over non-active areas and overlaps the n well and p well borders. The process creates rugged topography by forming the LOCOS masking layer and the field oxide regions. The substrate surface is lower in the n well region where the oxide masking layer (LOCOS) consumed the silicon substrate. Finally, a thermal treatment is used to drive-in of the implanted ions to obtain adequate well depth. This thermal treatment causes well impurity concentrations to decrease by mutual impurity diffusion at the boundary region of adjacent n-wells and p-wells. The decrease in well impurity concentration induces increased susceptibility to latch-up because of the increased current gain of the parasitic bipolar transistors in the well structure. Several two-mask variations are known, but they all have the same mask alignment problem and require the expense of two separate photolithography steps.

Several single mask processes are also known. Sung (5,573,963) discloses a one photo mask, self-aligned twin well process using BPSG layer as an implant mask. The process begins by forming spaced field oxide regions in a substrate defining first regions (e.g. n-wells) and second regions (e.g. p-wells). An ion implant masking layer composed of borophosphosilicate glass (BPSG), and a nitride barrier layer are formed over the field oxide regions and the substrate. Using a patterned photoresist layer, the nitride barrier layer and upper portions of the BPSG masking layer over the n-well regions are anisotropically etched. The photoresist layer is then removed. Next, the remaining BPSG masking layer over the n-well region is selectively etched. N-type impurities are implanted into the n-well region using the nitride layer and BPSG masking layer as an implant mask. P-type impurities are then implanted into the substrate, forming a p-type layer beneath the n-well regions and in the p-well regions. The nitride layer and BPSG layer are removed, and the substrate is annealed to drive in the implanted impurities, thereby forming n-wells and p-wells. As with the LOCOS process, the thermal drive-in of implanted ions increases the susceptibility to latch-up.

Horiuchi, et. al.; "A 7-MASK CMOS PROCESS WITH SELECTIVE OXIDE DEPOSITION", (IEEE TRANSACTIONS ON ELECTRON DEVICES, Vol. 40, No. 8, August, 1993) discloses a one-mask, twin well process using a selective liquid phase oxide deposition (LPD) process. After the first implants masked by photoresist, the LPD process is used to create an oxide mask over the first well regions for the second implants. The LPD process can deposit a mask of sufficient thickness for high energy implants for retrograde well formation. Retrograde well formation eliminates the need for thermal drive-in, increasing well impurity concentrations and decreasing latch-up susceptibility.

The importance of overcoming the various deficiencies noted above is evidenced by the extensive technological development directed to the subject, as documented by the relevant patent and technical literature. The closest and apparently more relevant technical developments in the patent literature can be gleaned by considering: U.S. Pat. No. 5,393,677(Lien) shows a one mask method for forming twin P/N wells. U.S. Pat. No. 5,252,501(Moslehi) shows a method of forming a single mask twin wells. U.S. Pat. No. 5,506,438(Hsue) discloses a semiconductor device having twin wells. U.S. Pat. No. 5,091,332(Bohr) teaches a method for forming twin wells and FOX. U.S. Pat. No. 5,547,894 (Mandelman) shows a method for forming p and N wells. U.S. 5,583,062(Kapoor) teaches a method Self-aligned twin wells having a $SiO_2$ /poly/$SiO_2$ barrier mask. U.S. Pat. No. 5,670,395(Pan) shows a method for forming self-aligned twin P/N wells that uses a conformal oxide or spin-on-glass oxide that is less than optimal for gap filling small openings.

SUMMARY OF THE INVENTION

It is an object of the present invention to form n-wells and p-wells in one substrate using a single photo mask.

It is an object of the present invention to form n-wells and p-wells in one substrate using a single photo mask and a HDPCVD oxide layer that allows gap filling in opening below the 0.6 $\mu$m well to well ground rule level.

It is an object of the present invention to reduce the process time and complexity when forming n-wells and p-wells in one substrate.

It is an object of the present invention to avoid the tolerance stack-up (or overlay) problem associated with multiple photo masks.

It is an object of the present invention to form n-wells and p-wells in one substrate without using a thermal drive-in step.

It is an object of the present invention to form n-wells and p-wells in one substrate whereby the photoresist layer does not have to be thick enough to mask high energy ion implantation.

It is an object of the present invention to form n-wells and p-wells in one substrate whereby the thickness of the photoresist layer does not have to be monitored and controlled to assure proper ion implantation depths.

It is an object of the present invention to form n-wells and p-wells in one substrate whereby the effect of photoresist pull back on edge locations of the wells are minimized.

To accomplish the above objectives, the present invention provides a method for forming both n and p wells in a semiconductor substrate using a single photolithography masking step comprising the steps of:

A preferred embodiment for a method for forming both n and p wells in a semiconductor substrate using a single photolithography masking step, a non-conformal oxide layer and a chemical-mechanical polish step, is describe below.

A screen oxide layer is formed on a semiconductor substrate. A nitride layer is formed on the screen oxide layer. A photoresist layer is coated over the nitride layer. The photoresist layer is exposed to actinic light and developed to form a photoresist mask having an opening to the nitride layer where first wells are to be formed. The exposed nitride layer is etching away to expose the underlying screen oxide layer to form a first opening in the nitride layer over regions of the substrate where first wells will be formed. We implant impurities of a first conductivity type into the substrate to form first well regions. The photoresist layer is removed.

In a key step, a non-conformal oxide layer is formed over the first well regions and the nitride layer. It is critical that the non-conformal oxide layer formed using a HDPCVD process.

The non-conformal oxide layer is chemical-mechanical polished stopping at the nitride layer. The nitride layer is removed using a selective etch, to form second openings in the remaining non-conformal oxide layer over areas where second well will be formed in the substrate. Using the remaining non-conformal oxide as a mask, we implant impurities of the second conductivity type through the second openings to form second wells. The remaining non-conformal oxide layer and the screen oxide layer are removed.

The inventor has found that only a non-conformal oxide layer made by high density plasma chemical vapor deposition (HDPCVD) can properly fill the first openings 15 between the nitride blocks 14 in a 0.6 μm well to well ground rule.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

The present invention will be described in detail with reference to the accompanying drawings. The present invention provides a method of forming n-type wells and p-type wells in one substrate using a single photo mask.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known process have not been described in detail in order to not unnecessarily obscure the present invention.

A preferred embodiment for a method for forming both n and p wells in a semiconductor substrate using a single photolithography masking step, a non-conformal oxide layer and a chemical-mechanical polish step, is describe below.

Figure 1:
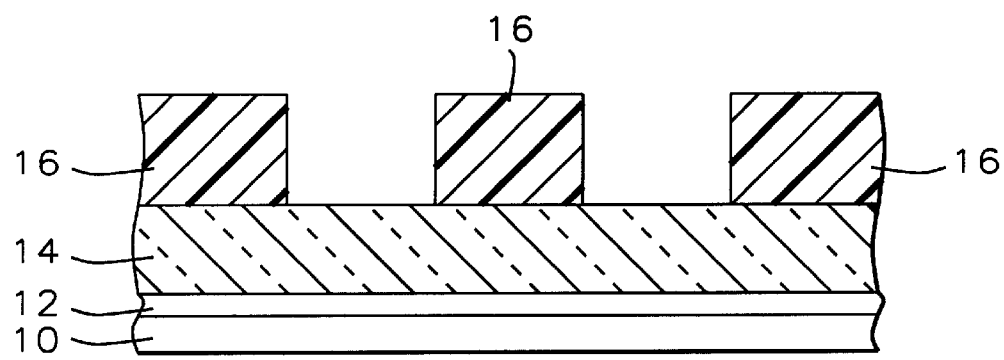
FIGS. 1 through 6 schematically illustrate in cross-sectional representation a preferred embodiment of the present invention.

FIG. 1 shows a screen oxide layer 12 is formed on a semiconductor substrate 10. The screen oxide is preferably formed by a thermal process and preferably has thickness of between about 80 and 120 Å.

Next, a barrier layer (14) is formed on the screen oxide layer (12). The barrier layer composed of nitride has a thickness of between about 6000 and 8000 Å. The barrier layer 14 can also be composed of oxynitride or preferably a bi-layer of a nitride layer over an oxide layer (NO).

Subsequently, a photoresist layer is coated over the barrier layer 14. The photoresist layer is exposed to actinic light and developed to form a photoresist mask 16 having an opening to expose the barrier layer 14 in areas where first wells are to be formed.

Figure 2:
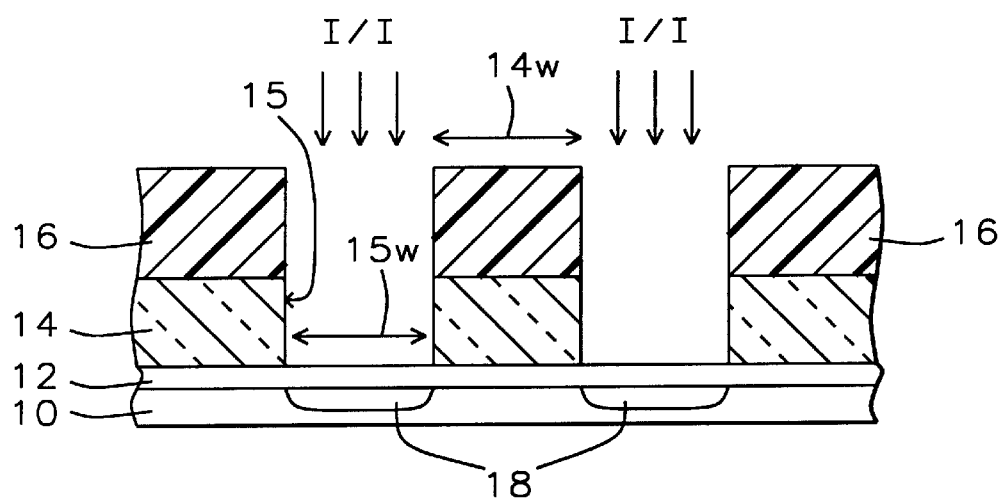

Referring to FIG. 2, the exposed barrier layer is etched away to expose the underlying screen oxide layer 12 to form a first opening 15 in the barrier layer (14) over regions of the substrate where first wells will be formed.

The openings 15 preferably have a width 15W of greater than 0.6 μm and more preferably between about 0.6 μm and 10 μm. The nitride blocks 14 preferably have a width 14W greater than 0.6 μm and more preferably between 0.6 μm and 10 μm.

Figure 7:
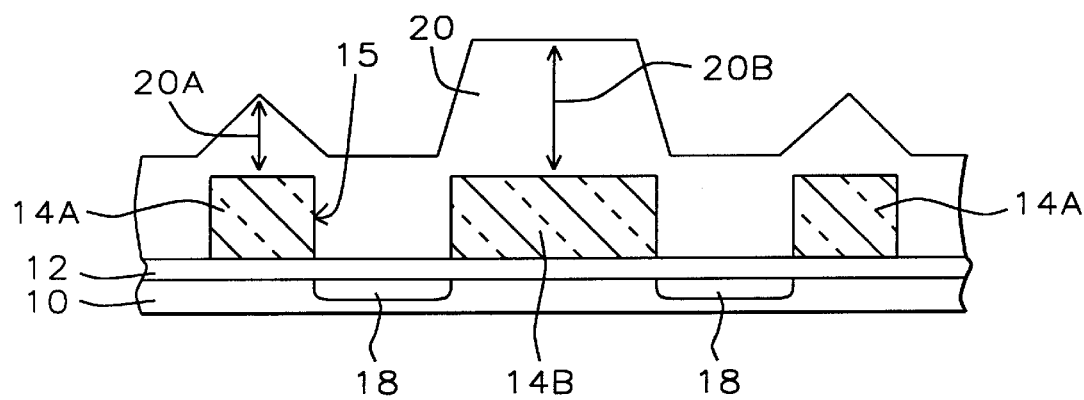
FIG. 7 shows a cross sectional view of the invention's non-conformal oxide layer implemented in 0.6 μm and smaller ground rules for well to well isolation according the present invention.

As shown in FIG. 7, the barrier layer is comprised of first 14B and second barrier 14A blocks. The first barrier block 14B is wider than said second barrier block 14A.

Next, we implant impurities of a first conductivity type into the substrate to form first well regions 18. The first well regions can be P-type or N-type. Most preferably the first wells are n-type.

When the first conductivity type impurities are N-type impurities of P or As ions and the implant is performed at a dose between about 1E2 and 1E4 Atom/cc and an energy between about 300 KeV and 500 KeV; and the first wells 18 have a impurity concentration between 1E15 and 1E18 and a depth between about 8000 and 12,000 Å.

When the first conductivity type impurities are P-type impurities of B or Indium and the implant is performed at a dose between about 1E2 and 1E4 Atoms/cm$^2$; and an energy between about 100 and 200 KeV. The first wells have a impurity concentration between 1E15 and 1E18 atom/cc and a depth between about 8000 and 12000 Å below the substrate surface.

Figure 3:
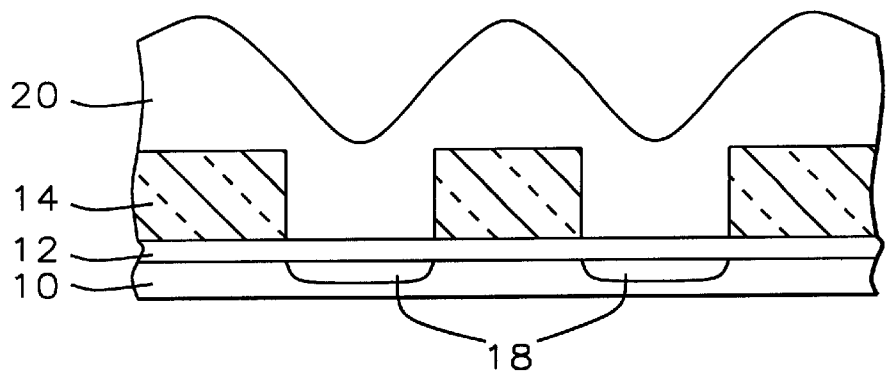

As shown in FIG. 3, the photoresist layer 16 is removed.

Critical HDP-CVD no-conformal oxide 20 process

Still referring to FIG. 3, in a critical step, a non-conformal oxide layer 20 is formed over the first wells 18 and the barrier layer (14). It is critical that the non-conformal oxide layer 20 formed using a HDPCVD process. Non-conformal means that the layer is not of uniform thickness. The non-conformity of the invention's oxide layer is caused by the simultaneous deposition and sputter of the HDP-CVD process. The inventor has found that only a non-conformal oxide layer made by high density plasma chemical vapor deposition (HDPCVD) can properly fill the first openings 15 between the nitride blocks 14 in a 0.6 μm well to well ground rule. That is conventional oxides (e.g., TEOS and Silane based) and organic polymers will not adequately gap fill between the nitride blocks. Also, as explained later, conformal oxides do not planarize with CMP processes.

FIG. 7 shows the HDP oxide 20 that is formed over first and second barrier blocks. The oxide layer 20 is thicker 20B over the wider blocks 14B and thinner over the narrow blocks 14A. This thick and thin oxide layer 20 is a function of the HDPCVD process and more particularly the invention's key deposition to sputter ratio.

A high density plasma chemical vapor deposition (HDPCVD) oxide layer 20 (or ICP HPDCVD) is formed over screen oxide layer and barrier layer filling the openings in the barrier layer.

High density plasma (HDP) oxide deposition is defined as chemical vapor deposition with simultaneous dc-bias sputtering using a mixture of silicon -containing, oxygen containing and non-reactive gasses (e.g., noble gasses). High density plasma sources supply low-energy ions with densities greater than 1E12 cm$^{-2}$. In HDP oxide deposition, bias sputtering is achieved by a rf bias separately applied to the substrate to avoid charge accumulation. During deposition, the substrate is self-biased to a dc voltage that serves to accelerate Ar ions for Bias sputtering and controlling the film properties, deposition rates, etc. This method generally forms a high quality oxide with good thermal stability, low moisture uptake and fine mechanical properties. It is recognized that HDP-SiO$_2$ deposition techniques employs simultaneous deposition and dc-bias sputtering to enhance gap-filling. This is an important difference between the invention's HDPCVD oxide layer and prior art CVD, and thermal oxide layers that are conformal and will not CMP properly in small gap fill dimensions (e.g. small opening widths 15W). Importantly, the invention's HDPCVD layer forms thicker (20A) with the thickness proportional to the widths 14W of the barrier layer blocks 14 (14A 14B—see FIG. 7).

The HDPCVD process is preferably performed at the set points shown below:

TABLE

Preferred HDPCVD process parameters for layer 20

| Process type HDPCVD | units | Low | tgt | hi |
|---|---|---|---|---|
| Thickness | Å | 2K (2000) | 8K | 12K (12,000) |
| Reactant gases SiH$_4$, O$_2$ and Ar sputter | | | | |
| oxygen flow rate | sccm | 150 | 250 | 300 |
| Reactant gasses SiH4 | sccm | 70 | | 200 |
| pressure | mtorr | 3 | 9 | 10 |
| RF | | 2000 | | 5000 |
| wafer temperature | C° | 600 | | 750 |
| HDPCVD - hi sputter rate | (Å/min) | 1000 | | 2000 |
| Deposition to Etch ratio | | 2.5:1 | | 9:1 |

The HDPCVD process is a "high sputter Process" because the sputter rate is high and the Deposition to sputter (D/S or Dep to etch ratio) ratio is low. The HDPCVD process critically has deposit to sputter ratio between 2.5:1.0 and 9.0:1 and is most preferably between about 2.5:1 and 4:1.

For 0.6 μm ground rule products, the gap fill oxide 20 capability need to be considered. The non-conformal layer must be formed using HDPCVD. The feature of HDPCVD oxide is that this is a triangle shape oxide 20 on the small width nitride blocks 14A and thicker oxide 20 over the wide nitride blocks 14B(as shown in FIG. 7). Thus CMP is required for planarization. An etch back planarization is not feasible. Nitride is a good stop layer for chemical-mechanical polish and is easily removed by H$_3$PO$_4$ .

Figure 4:
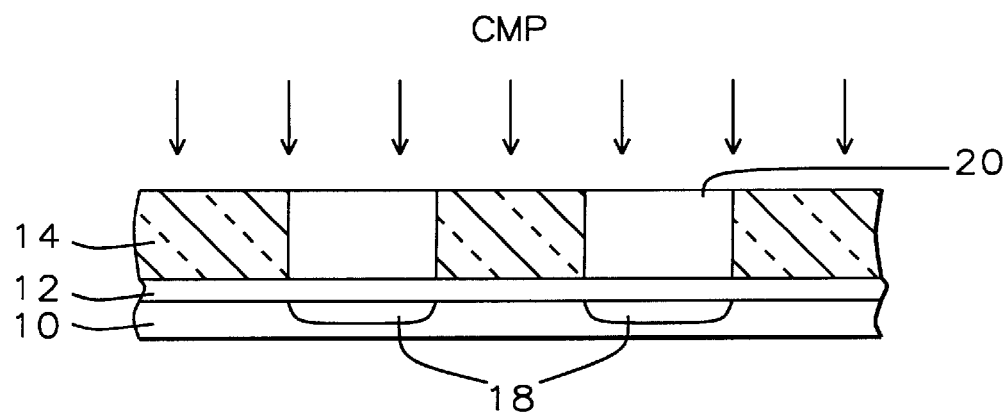
Figure 5:
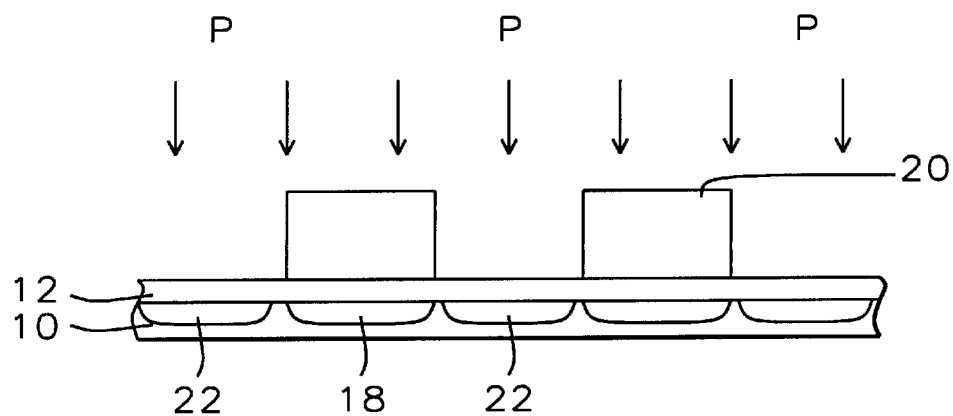

Referring to FIG. 4, in a key step, the non-conformal oxide layer (16) is chemical-mechanical polished stopping at the barrier layer (14) . The barrier layer is used as a CMP stop. The CMP planarizes the non-conformal oxide layer 16. Here it is important that a CMP process is used and not an etch back process. This is because an etch back process would remove the oxide in the opening.

FIG. 4 shows the barrier layer (14) is removed using a selective etch, to form second openings in the remaining non-conformal oxide layer 16 over areas where second well will be formed in the substrate. The barrier layer is preferably removed using H$_3$PO$_4$.

Using the remaining non-conformal oxide (16) as a mask, we implant impurities of the second conductivity type through the second openings to form second wells 22. The first and second conductivity type are opposite (e.g., P and N or N and P)

When the second conductivity type impurities are N-type impurities of P or As ions and the implant is performed at a dose between about 1E2 and 1E4 Atom/cc; and an energy between about 300 KeV and 500 KeV; and the second well 22 have a impurity concentration between 1E15 and 1E 18 and a depth between about 8000 and 12,000 Å.

When the second conductivity type impurities are P-type impurities of B or Indium and the implant is performed at a dose between about 1E2 and 1E4; and an energy between about 100 and 200 KeV. The second wells have an impurity concentration between 1E15 and 1E18 atom/cc and a depth between about 8000 and 12000 Å below the substrate surface.

The first and second wells don't require a drive in because the dosage can be implanted into the substrate to sufficient depth.

Figure 6:
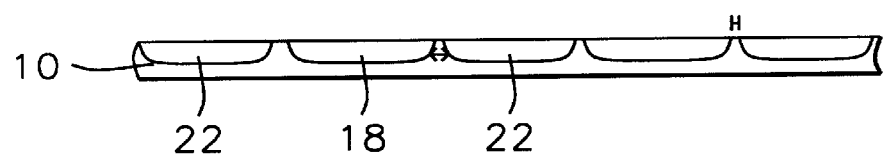

FIG. 6 shows the remaining non-conformal oxide layer 16 and the screen oxide layer are removed. Normal process continues to produce semiconductor devices on the substrate.

It is important to note that a Well drive in heat cycle (e.g., anneal or rapid thermal anneal) is not used.

The first and said second well regions 18 22 preferably do not overlap and a well drive-in is not used. If a drive in is used, the first and second well will diffuse towards each other and degrade the electrical properties.

Adjacent n-well to n-well spacing and p-well to p-well spacing is preferably 0.6 mu or less and more preferably of between about 0.6 μm and 0.3 μm. Illustration of invention's Critical HDPCVD oxide layer 20 and CMP planarization FIG. 7 shows the critical features of the invention's HDPCVD oxide 20 process. A key feature of the invention's HDPCVD process with deposition to sputter ratios between 2.5:1 and 9: and more preferably between 2.5:1 and 4: 1, is the triangle shape of the thinner oxide 20A over the smaller width barrier layer 14A compared to the thicker oxide 20B over the wider barrier layer 14B. The oxide 20B is thicker than oxide 20A. The oxide 20B is preferably between about 15 to 40% thicker than oxide 20A. The chemical-mechanical polish, not wet or dry chemical etch back, can be used for planarization of HPDCVD oxide layer 20. The thicker oxide over the wider barrier layer 14B blocks allows the oxide to be polished longer over the wide areas and only after the thick oxide (20B) is polished down to the level of the thinner oxide (thickness=20A) will the thinner oxide be polished. This ensures that all the oxide is removed using the CMP process and that no oxide is left over the wide barrier layer regions 14B and that dishing does not occur in the areas where no barrier layers is (e.g., the opening 15 in the barrier layer).

In addition, the nitride barrier layer 14 is a good polish stop layer for oxide CMP and it is easily removed by $H_3PO_4$.

Figure 8:
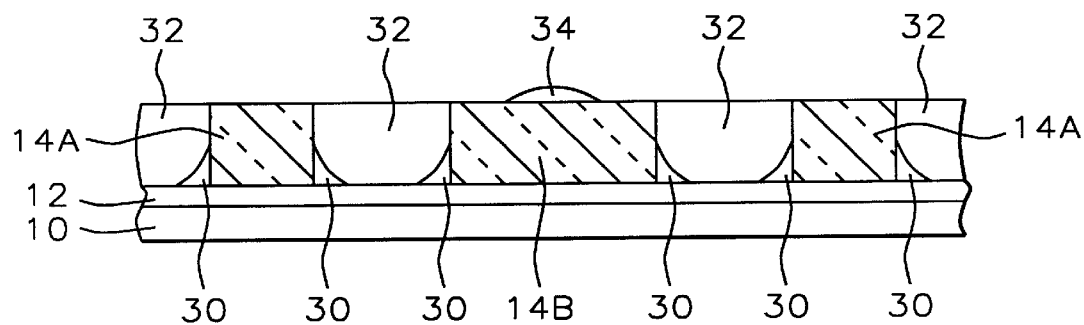
FIG. 8 shows a cross sectional view of the conformal oxide 32 that has voids 30 and residual oxide 34 over the barrier layer 14B using a process known by the inventors.

In contrast with the invention's HDPCVD oxide, if a conformal oxide layer 20 was formed, the oxide layer 20 would have the same thicknesses over the wide and narrow barrier layer blocks. This would mandate that an etch back, not CMP be used to planarized the conformal oxide layer. As shown in FIG. 8, the CMP of a conformal oxide layer would leave residual oxide 34 over the wide barrier layer 14B portions. If an over-polish was used to remove all the oxide over the wide barrier layer 14B blocks, then the oxide would dish between in the openings 15. Also, FIG. 8 shows the voids 30 caused by the inability of the conformal oxide to gap-fill in the opening between the barrier layer blocks.

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method for forming both n and p wells in a semiconductor substrate using a single photolithography masking step, a non-conformal oxide layer and a chemical-mechanical polish step, comprising the steps of:
   a) forming a screen oxide layer on a semiconductor substrate;
   b) forming a barrier layer on said screen oxide layer;
   c) coating a photoresist layer over said barrier layer;
   d) exposing said photoresist layer and developing said photoresist layer to form a photoresist mask having an opening to said barrier layer where first wells are to be formed;
   e) etching away said exposed barrier layer to expose said underlying screen oxide layer to form a first opening in said barrier layer over regions of the substrate where first wells will be formed;
   f) implanting impurities of a first conductivity type into said substrate to form first well regions;
   g) removing said photoresist layer;
   h) forming a non-conformal oxide layer over said first well regions and said barrier layer; said non-conformal oxide layer formed using a high density plasma chemical vapor deposition (HDPCVD) process using a sputter/deposit process;
   i) chemical-mechanical polishing said non-conformal oxide layer stopping at the barrier layer;
   j) removing said barrier layer using a selective etch, to form second openings in the remaining non-conformal oxide layer over areas where second well will be formed in said substrate;
   k) using the remaining non-conformal oxide as a mask, implanting impurities of the second conductivity type through said second openings to form second wells; and
   l) removing the remaining non-conformal oxide layer and said screen oxide layer.

2. The method of claim 1 wherein said barrier layer is comprised of silicon nitride.

3. The method of claim 1 wherein said first wells are n-type and said second well are p-type.

4. The method of claim 1 wherein said first well regions are p-type and said second well regions are n-type.

5. The method of claim 1 wherein said first and said second well regions do not overlap and a well drive-in is not used.

6. The method of claim 1 wherein said first conductivity type impurities are N-type impurities of P or As and the implant is performed at a dose between about 1E2 and 1E4 atom/$cm^2$; and an energy between about 300 and 500 KeV and said first wells have a impurity concentration between 1E15 and 1E18 atom/cc and a depth between about 8000 and 12000 Å.

7. The method of claim 1 wherein said first conductivity type impurities are P-type impurities of B or Indium and the implant is performed at a dose between about 1E2 and 1E4 atom/$cm^2$; and an energy between about 100 and 200 KeV said first wells have a impurity concentration between 10E15 and 10E18 atom/cc and a depth between about 8000 and 12000 Å.

8. The method of claim 1 wherein said second conductivity type impurities are N-type impurities of P or As ions and the implant is performed at a dose between about 1E2 and 1E4 Atom/cc; and an energy between about 300 KeV and 500 KeV; and the second well 22 have a impurity concentration between 1E15 and 1E18 and a depth between about 8000 and 12,000 Å.

9. The method of claim 1 wherein said second conductivity type impurities are P-type impurities of B or Indium and the implant is performed at a dose between about 1E2 and 1E4 atom/Cm$^2$; and an energy between about 100 and 200 KeV, said second wells have an impurity concentration between 1E15 and 1E18 atom/cc and a depth between about 8000 and 12000 Å below the substrate surface.

10. The method of claim 1 wherein said non-conformal oxide layer is formed using a HDPCVD process comprising:

an oxygen flow rate between 150 and 300 sccm; SiH4 flow between 70 and 200 sccm; and a pressure between 3 and 10 mTorr; a RF power between 2000 and 5000 W; a wafer temperature between 600 and 750 C.°; a HDPCVD sputter rate between 1000 and 2000 Å/min; a deposition to sputter (deposition to etch) ratio between 2.5:1 and 9: 1; and said conformal oxide layer has a thickness between 2000 and 12000 Å.

11. The method of claim 1 wherein said barrier layer is comprised of first and second barrier blocks; said first barrier block is wider than said second barrier block; and said non-conformal oxide layer is thicker over said first barrier block than over said second barrier block.

12. The method of claim 1 wherein said barrier layer is comprised of first and second barrier blocks; said first barrier block is wider than said second barrier block; and said non-conformal oxide layer is thicker over said first barrier block by a percentage between 15 and 40% than over said second barrier block.

13. The method of claim 1 wherein said non-conformal oxide layer is formed using a HDPCVD process comprising:

an oxygen flow rate between 150 and 300 sccm; SiH4 flow between 70 and 200 sccm; and a pressure between 3 and 10 mTorr; a RF power between 2000 and 5000 W; a wafer temperature between 600 and 750 C.°; a HDPCVD sputter rate between 1000 and 2000 Å/min; a deposition to sputter (deposition to etch) ratio between 2.5:1 and 4:1; and said conformal oxide layer has a thickness between 2000 and 12000 Å.

14. The method of claim 1 wherein said barrier layer has a thickness of between about 6000 and 8000 Å.

15. A method for forming both n and p wells in a semiconductor substrate using a single photolithography masking step, a non-conformal oxide layer and a chemical-mechanical polish step, comprising the steps of:

a) forming a screen oxide layer on a semiconductor substrate;

b) forming a barrier layer on said screen oxide layer; said barrier layer comprised of silicon nitride;
  (1) said barrier layer has a thickness of between about 6000 and 8000 Å;

c) coating a photoresist layer over said barrier layer;

d) exposing said photoresist layer and developing said photoresist layer to form a photoresist mask having an opening to said barrier layer where first wells are to be formed; said barrier layer is comprised of first and second barrier blocks; said first barrier block is wider than said second barrier block;

e) etching away said exposed barrier layer to expose said underlying screen oxide layer to form a first opening in said barrier layer over regions of the substrate where first wells will be formed;

f) implanting impurities of a first conductivity type into said substrate to form first well regions;
  (1) said first conductivity type impurities are N-type impurities of P or As and the implant is performed at a dose between about 1E2 and 1E4 atom/cm$^2$; and an energy between about 300 and 500 KeV and said first wells have a impurity concentration between 1E15 and 1E18 atom/cc and said first well has a depth between about 8000 and 12000 Å;

g) removing said photoresist layer;

h) forming a non-conformal oxide layer over said first well regions and said barrier layer; said non-conformal oxide layer formed using a high density plasma chemical vapor deposition (HDPCVD) process;
  (1) said non-conformal oxide layer is formed using a HDPCVD process comprising: an oxygen flow rate between 150 and 300 sccm; SiH4 flow between 70 and 200 sccm; and a pressure between 3 and 10 mTorr; a RF power between 2000 and 5000 W; a wafer temperature between 600 and 750 C.°; a HDPCVD sputter rate between 1000 and 2000 Å/min; a deposition to sputter (deposition to etch) ratio between 2.5:1 and 4: 1; and said conformal oxide layer has a thickness between 2000 and 12000 Å;

i) chemical-mechanical polishing said non-conformal oxide layer stopping at the barrier layer;

j) removing said barrier layer using a selective etch, to form second openings in the remaining non-conformal oxide layer over areas where second well will be formed in said substrate;
  (1) using the remaining non-conformal oxide as a mask, implanting impurities of the second conductivity type through said second openings to form second wells;
  (2) said second conductivity type impurities are P-type impurities of B or Indium and the implant is performed at a dose between about 1E2 and 1E4 atom/cm$^2$; and an energy between about 100 and 200 KeV; said second wells have an impurity concentration between 1E15 and 1E18 atom/cc and a depth between about 8000 and 12000 Å below the substrate surface;

k) removing the remaining non-conformal oxide layer and said screen oxide layer.

16. The method of claim 15 wherein said first and said second well regions do not overlap and a well drive-in is not used.

17. The method of claim 15 wherein said barrier layer is comprised of first and second barrier blocks; said first barrier block is wider than said second barrier block; and said non-conformal oxide layer is thicker over said first barrier block by a percentage between 15 and 40% than over said second barrier block.

* * * * *